US 6,734,744 B2

(12) United States Patent
Monzel et al.

(10) Patent No.: US 6,734,744 B2
(45) Date of Patent: May 11, 2004

(54) SRAM PROCESS MONITOR CELL

(75) Inventors: Carl A. Monzel, Lakeville, MN (US); Brandon R. Bartz, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 47 days.

(21) Appl. No.: 10/261,459

(22) Filed: Sep. 30, 2002

(65) Prior Publication Data

US 2004/0061561 A1 Apr. 1, 2004

(51) Int. Cl.[7] .............................. H03B 5/24; G01R 31/26
(52) U.S. Cl. .............................. 331/57; 331/44; 324/765
(58) Field of Search .............................. 331/44, 57, 74; 324/500, 765

(56) References Cited

U.S. PATENT DOCUMENTS 6,535,013 B2 * 3/2003 Samaan ...................... 324/765

* cited by examiner

Primary Examiner—David Mis
(74) Attorney, Agent, or Firm—Lathrop & Gage, L.C.

(57) ABSTRACT

A process monitor circuit useful for integrated circuit designs to provide manufacturing process tests for SRAM circuit structures incorporated in an integrated circuit design. In one aspect of the invention, the process monitor cell includes a plurality of SRAM circuit cells chained together in a manner to permit testing of a desired range of SRAM transistor power and a desired range of associated propagation delays. The process monitor cell thereby provides an accurate estimate of the quality of the fabrication process used to generate other functional SRAM cells within the integrated circuit design.

18 Claims, 3 Drawing Sheets

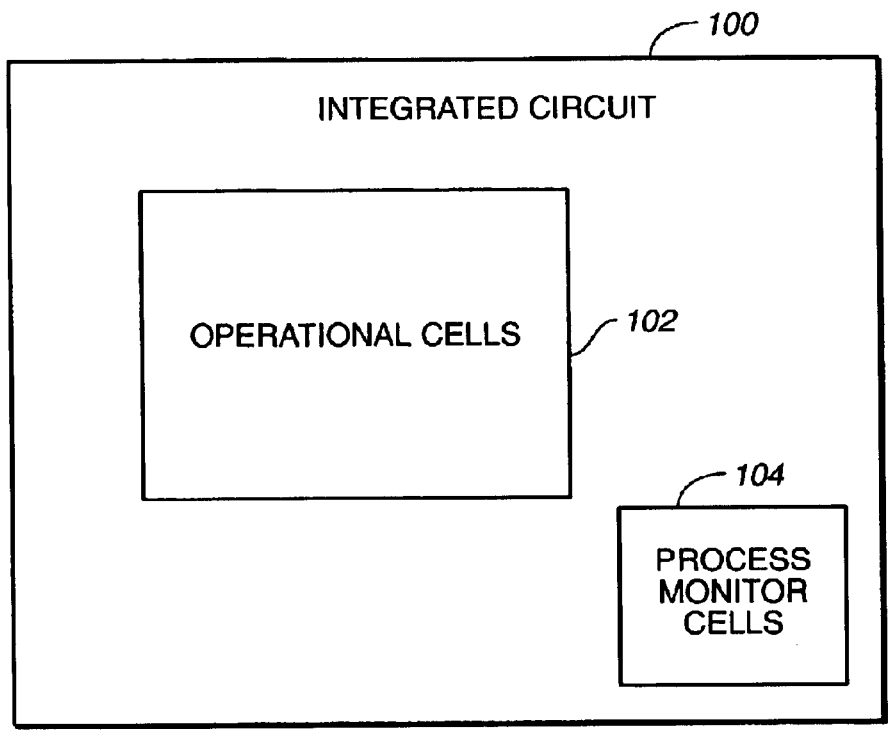
FIG._1
*(PRIOR ART)*
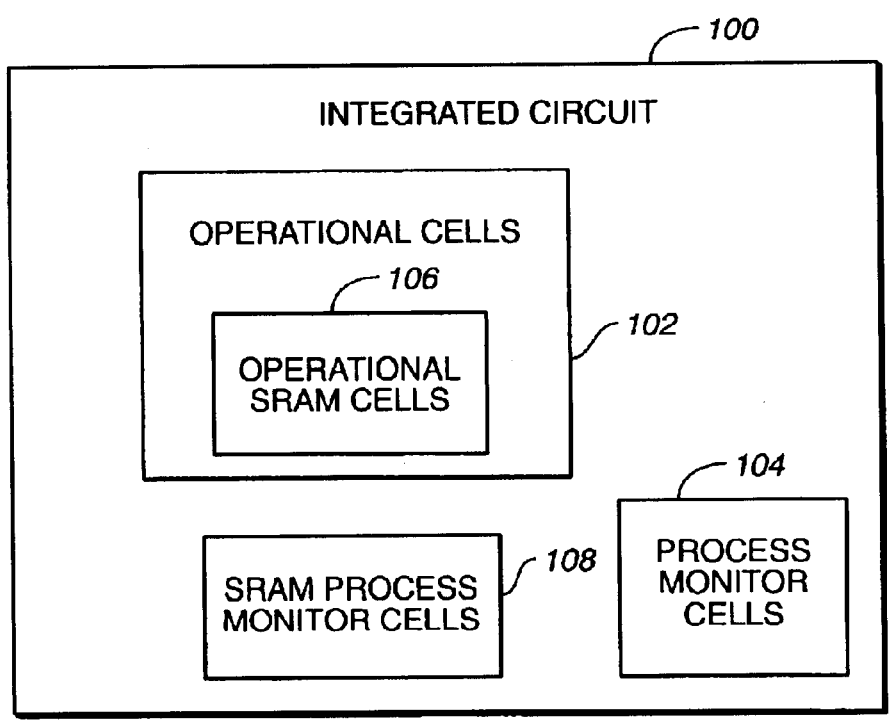
FIG._2

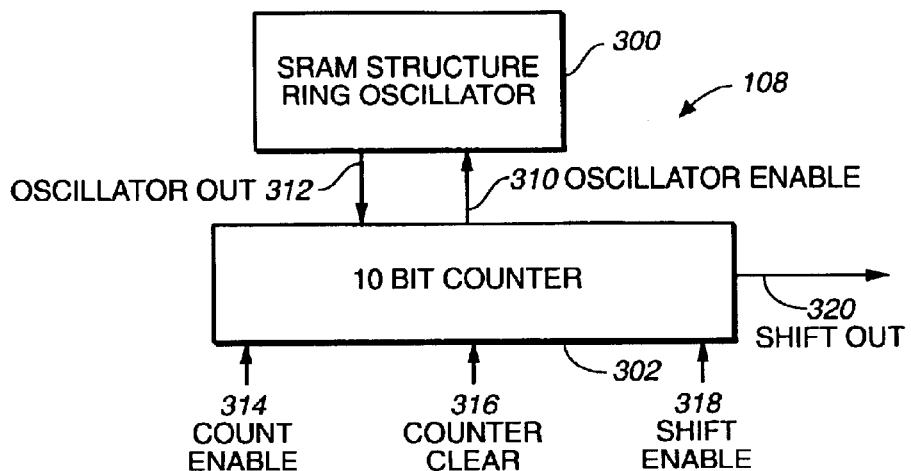
FIG._3
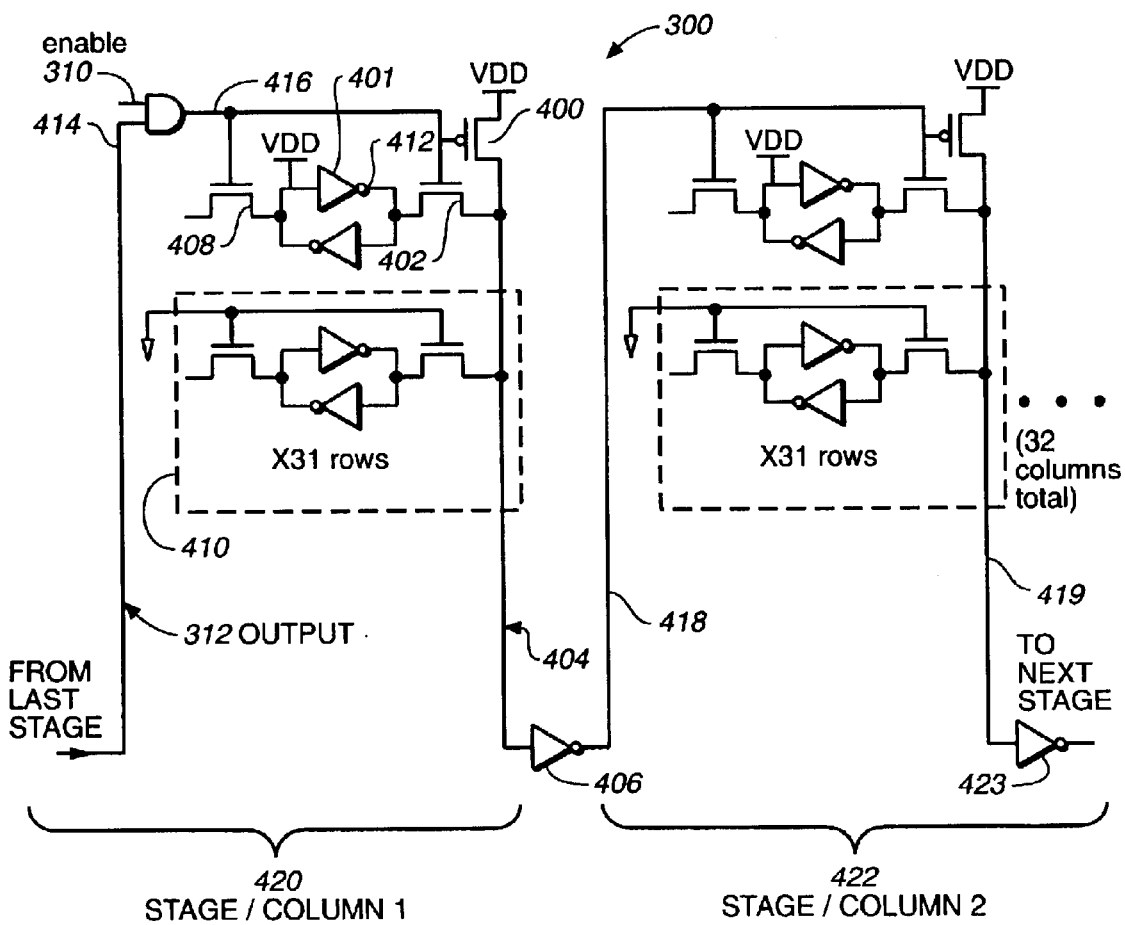
FIG._4

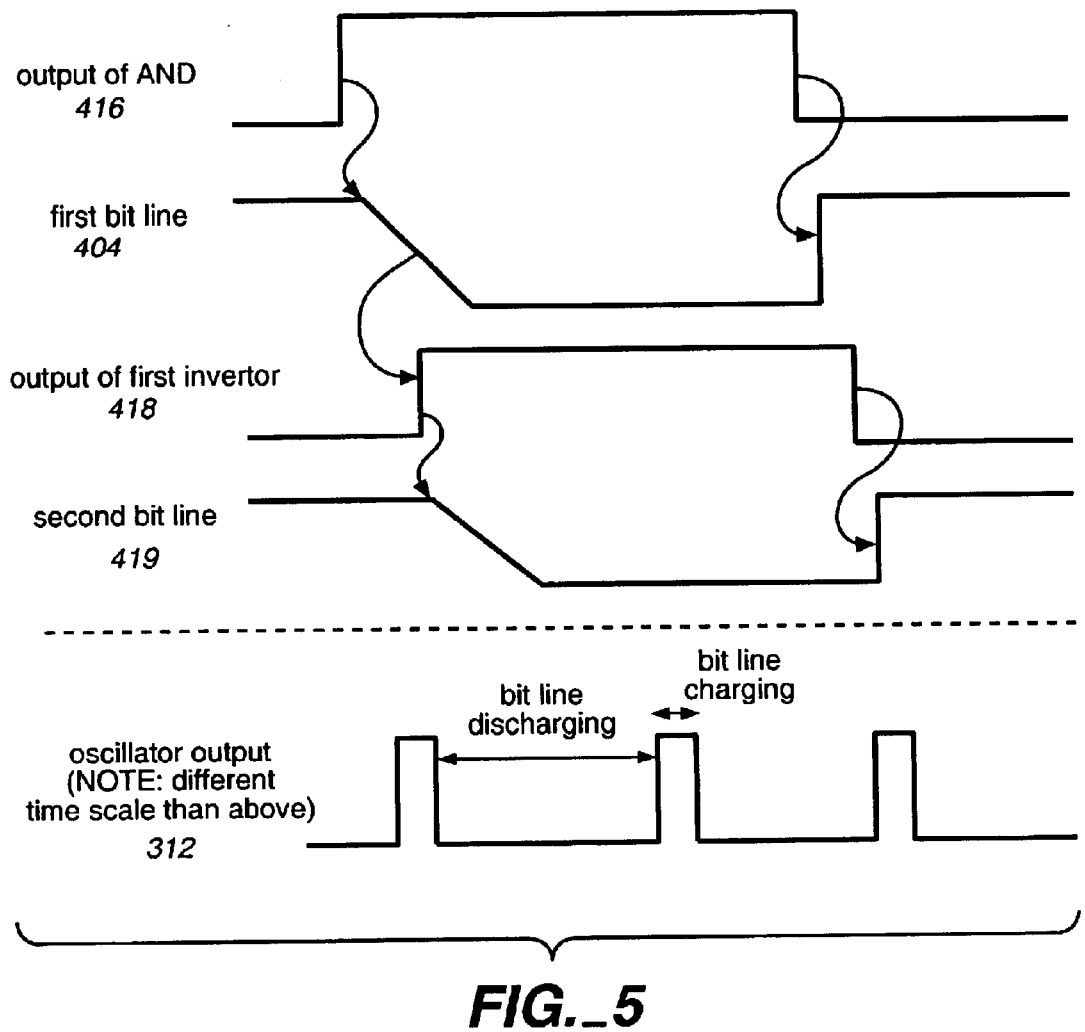
FIG._5

SRAM PROCESS MONITOR CELL

BACKGROUND OF THE INVENTION

1. Field of the Invention

The invention generally relates to integrated circuit design and more specifically relates to electronic circuit structures, and associated systems and methods, for an SRAM process monitor cell in integrated circuit design.

2. Discussion of Related Art

In the design of electronic circuits and systems it is well-known that the testing at the point of manufacture can help in reducing subsequent failures of such circuits and systems. Such early testing in the fabrication of electronic circuits and systems is often more cost-effective than later discovery of failures caused by the manufacturing process after products are created and utilized based on the flawed circuits and systems.

Historically, electronic circuits and systems were comprised of discrete electronic components mounted on the surface of printed circuit boards. Metal traces applied to the surfaces of such printed circuit boards provided interconnection of signals between the various discrete electronic components. Testing of such historical electronic circuits and systems following fabrication thereof was a simpler process. Probes could be physically applied to the various interconnected signal pathways to verify operation of each circuit as within specified parameters. Such probing could be done automatically using various robotic and automation devices and processes or could be preformed manually.

Later in the evolution of electronic circuits and systems, small-scale integrated circuits ("SSI") arose in which a small number of formerly discrete components were integrated into a single integrated circuit package. Although such SSI integrated circuits exposed a number of input and output signal paths through pins of the integrated circuit, various internal signal pathways within the integrated circuit were hidden from view. Such SSI devices led to some difficulties in testing electronic circuits and systems following fabrication because certain signal pathways were hidden within the integrated circuit packages of such small-scale integration devices. However, in view of the low degree of integration, relatively few such signal paths were rendered inaccessible for purposes of testing. Standard testing techniques as noted above were still applicable and useful even with such small-scale integration in the electronic circuit and system designs.

As the electronics industry further involved, the degree of such integration progressed to the point where present complex integrated circuit packages may include millions or even tens of millions of electronic circuits and interconnection pathways. Such a high degree of integration (sometimes referred to as very large-scale integration or VLSI) gives rise to significant difficulties in testing such integrated circuits post fabrication. A very large number of internal signal paths and devices are inaccessible external to the integrated circuit package and therefore cannot be effectively probed manually or automatically to evaluate the performance of an integrated circuit relative to specified parameters. Further exacerbating the problem of such circuit testing is the fact that the high degree of integration coupled with very high signaling speeds (i.e. very high clock rates) in modem integrated circuits requires extremely small tolerances in the integrated circuit manufacturing process. Conductive and dielectric material layers are deposited and etched in a substrate with sub-micron dimensions within the integrated circuit die. Manufacturing tolerances for such microscopic device structures are extremely tight. Small variations in the fabrication process can rendered devices unusable as outside specified parameters for proper functionality. Detecting such failures and variations in the fabrication process is a continuing problem in the design and manufacture of highly integrated circuits.

One common technique generally utilized in the design and fabrication of integrated circuits is to incorporate special circuitry intended solely for monitoring the quality of the fabrication process. Such special circuitry is often referred to as "process monitor" circuits or cells. As used herein, circuit and cell are used interchangeably. The term "cell" Is often used in integrated circuit design where libraries of "standard cells" (pre existing circuit architectures).are selected and used to generate a new custom integrated circuit design. Process monitor circuits are Included in the integrated circuit design by the design engineer and may be probed in post fabrication test procedures to determine if the fabrication process resulted in manufactured process monitor cells that function in accordance with desired specifications. Operation of the processes monitor cells provides a statistical basis for determining the quality of the fabrication process for the entire integrated circuit.

In general, process monitor circuits and cells consist of a number of standard gates and interconnecting signal pathways to allow for post fabrication testing of standard logic gate structures and interconnecting signal pathways within an integrated circuit design. Such process monitor cells serve as a statistical indicator of the quality of the fabrication process that produced the corresponding integrated circuit. If the process monitor cell operates in accordance with specified parameters as determined by post fabrication testing, the entire integrated circuit is presumed to have been manufactured with similar fabrication quality and therefore within specified parameters. If, conversely, the process monitor cell fails to operate within desired specified parameters, the corresponding integrated circuit may be presumed to include similar fabrication flaws and therefore may be discarded or downgraded prior to shipment or inclusion within other systems.

Often such process monitor circuits and cells are designed into an integrated circuit as "scribe line devices." Typically, modem integrated circuits are manufactured as a plurality of identical structures on a large substrate wafer. A scribe line is a boundary area of between adjacent integrated circuits on such a substrate wafer. The plurality of integrated circuits on a wafer are separated by scribe lines where the wafer will eventually be sliced to separate the individual integrated circuits. Scribe line devices are therefore electronic devices or signal paths designed into such scribe line areas separating the integrated circuits such that they may be utilized in post fabrication testing to test Integrated circuit quality and then may be discarded when the wafer is cut along the scribe lines to separate individual integrated circuits. Such scribe line devices allow designers to implement process monitor cells without utilizing valuable area within the intended integrated circuit design.

One significant problem in the use of scribe line devices for process monitor testing is that the scribe line devices may only be utilized while the entire wafer is intact. The scribe line devices are destroyed (or rendered otherwise inoperable) when the wafer is cut to separate individual integrated circuits. Hence, scribe line devices are incapable of testing individual integrated circuits once they have been cut from the wafer and packaged as a production component.

It is a particular problem to test the quality of a fabrication process for static RAM ("SRAM") devices. SRAM devices in integrated circuits are particularly small devices operating with very tight timing tolerances. The transistors and signal pathways in such SRAM devices are therefore more susceptible to fabrication process variations that affect the transistors size and interconnecting traces. For example, the impact of process variations on the current source/sink properties of such small transistors is proportionally greater than the Impact of the same process variations on larger devices of the integrated circuit. Electronic circuit designers therefore take great care in the design of SRAM components within an integrated circuit.

Because of these proportionately larger effects on small devices, existing process monitor cell architectures are inadequate for testing the fabrication process quality as it relates to such intricate SRAM structures. Standard process monitor circuits, as noted above, presently generally consist of standard logic gate and interconnect pathways to verify the quality of the fabrication process with respect to such devices. However, because of the enhanced sensitivity of SRAM devices to fabrication process variations, such existing process monitor cell structures are inadequate.

One current approach for evaluating fabrication process quality with respect to SRAM devices simply rely on inadequate evaluation by existing process monitor cell structures. As noted, such reliance on existing process monitor cells for testing fabrication quality as it relates to SRAM structures provides inadequate testing of SRAM structures within an integrated circuit. Another approach adds scribe line devices to enable external probing of current sink/source capabilities of pass gate transistors of SRAM memory cell structures within the integrated circuit design. Such testing requires external probing to determine current draw through the SRAM transistors as exposed through the scribe line devices. Further, as noted above, scribe line devices are destroyed when the wafer is sliced into individual integrated circuit devices and hence testing may only be performed on a full wafer of circuits rather than individual packaged integrated circuits.

It is therefore evident from the above discussion that a need exists for improved process monitor circuits and techniques specifically adapted for evaluating fabrication process quality with respect to SRAM structures of an integrated circuit.

SUMMARY OF THE INVENTION

The present intervention solves the above and other problems, thereby advancing the state of the useful arts, by providing a new process monitor circuit structure and technique specifically adapted to evaluate fabrication process quality as regards to SRAM structures. More specifically, the improved process monitor circuit structure utilizes SRAM cell structures added to a circuit design to evaluate parametric measurements of the SRAM fabrication process. In one aspect, the invention measures the current sink performance of SRAM transistors in the SRAM cells of the process monitor circuit. In another aspect of the invention, the process monitor circuit measures transistor performance and propagation delays in SRAM cell components of the process monitor circuit.

BRIEF DESCRIPTION OF THE DRAWINGS

FIG. 1 is a block diagram of an integrated circuit incorporating process monitor cells in accordance with presently known techniques.

FIG. 2 is a block diagram depicting an integrated circuit including operational SRAM cells and related SRAM process monitor cells in accordance with an aspect of the present invention.

FIG. 3 is a block diagram of an SRAM process monitor cell in accordance with an aspect of the present invention.

FIG. 4 provides additional details of the SRAM structure ring oscillator portion of the SRAM process monitor cell of FIG. 3.

FIG. 5 is a timing diagram useful in understanding signals of the SRAM structure ring oscillator of FIG. 4.

DETAILED DESCRIPTION OF THE PREFERRED EMBODIMENTS

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 Is a block diagram of a typical integrated circuit incorporating process monitor cell features in accordance with presently known practices. In particular, integrated circuit 100 includes numerous operational cells 102 providing desired functionality as intended by the circuit designers. Process monitor cells 104 are further incorporated within the integrated circuit 100 to provide fabrication process quality measurement with on chip test procedures. Process monitor cells typically include a counter mechanism for counting particular sensed events indicative of the fabrication process quality. A performance sensing circuit associated with each process monitor cell is coupled to the counter to generate an appropriate a pulse signal each time a detected event occurs. As discussed above, existing process monitor cell structures consist of typical logic gates and interconnects therebetween often configured in a ring oscillator structure to provide a periodic pulse indicative of the performance of the associated logic gates and interconnecting signal paths. Further, as discussed above, existing process monitor cell structures are inadequate for testing the tighter tolerances required for SRAM circuit structures.

FIG. 2 is a block diagram depicting the integrated circuit 100 of FIG. 1 where operational cells 102 are designed to include SRAM operational cells 106. In such an integrated circuit 100, previously known process monitor cells 104 are inadequate for testing process quality as regards the inclusion of operational SRAM cells 106 in the integrated circuit 100. Therefore, SRAM process monitor cells 108 are provided in accordance with an aspect of the present invention to provide enhanced fabrication process quality testing capabilities capable of measuring performance and tolerances appropriate to SRAM circuit devices within an integrated circuit.

FIG. 3 is a block diagram depicting an SRAM process monitor cell 108 in accordance with the present invention. The overall structure of SRAM process monitor cell 108 is similar to previously known process monitor cells in that a ring oscillator generates a periodic pulse signal indicating detection of events representing measured parametrics of the quality of the fabrication process of the integrated circuit. As shown in FIG. 3, SRAM structure ring oscillator 300 provides such event detection pulses corresponding to structures relevant to SRAM devices. Process monitor cell 108 is therefore improved over prior process monitor cells in accordance with the present invention so as to provide parameter measurements of interest to SRAM circuit fabrication processes relating to the integrated circuit.

SRAM structure ring oscillator 300 is enabled to operate in response to an enable signal applied via path 310 by counter circuit 302 or other controlling circuits (not shown). When so enabled, SRAM structure ring oscillator 300 generates a periodic pulse signal and applies the pulse signal to oscillator output signal path 312.

Counter 302 receives oscillator output signals on path 312 and counts the number of pulses applied thereto. Counter 302 is enabled by application of an enable signal to input signal path 314 of counter 302. A counter clear signal applied to path 316 resets counter 302 to commence counting of a new sequence of pulses. Counter 302 causes its present count value to be applied serially to the shift out signal path 320 in response to an enable signal applied to shift enable path 318.

Overall structure and design of such a process monitor cell is well-known to those of ordinary skill in the art. However, the present invention improves process cell monitor 108 by utilizing an SRAM structure ring oscillator 300 to measure process related parameters associated with SRAM circuit designs. This enhanced process monitor cell structure allows more accurate testing of fabrication process quality as it relates to the tight tolerances associated with SRAM circuits in a circuit design.

Those of ordinary skill in the art will recognize that counter 302, though depicted as a 10-bit counter structure, may provide any number of bits for counting pulses applied thereto. Further, those of ordinary skill in the art will recognize that an external control elements (not shown) may generate enable signals on path 310 and 314 and 318 as well as a clear signal on path 316. Design of such control elements as well as the design choices associated with the size of counter 302 are well-known to those of ordinary skill in the art and need not be presented further herein. Still further, utilization of the counter value generated within counter 302 as shifted out serially via shift out path 320 is well-known to those of ordinary skill in the art. Further, the counter value may be applied to a parallel set of signal paths rather than shifted serially on a single bit data path.

In general, the ratio of an expected count to the actual count detected during operation of the integrated circuit helps determine the quality of the integrated circuit as affected by fabrication processes and methods. An integrated circuit where the actual count is a less than the expected count may be presumed to be operating slower than the intended design whereas an integrated circuit indicating an actual count higher than the expected count value may be capable of operating at the anticipated clock rate (or higher). Such a ratio may be used for discarding integrated circuits that failed to meet the minimum standard for performance and/or for classifying the performance level of integrated circuits above a minimum threshold ratio level.

FIG. 4 provides additional detail of the SRAM structure ring oscillator 300 discussed above in reference to FIG. 3. In general, any ring oscillator structure comprises a sequence of circuits daisy-chained sequentially one to the next with the last element in the chain providing input to the first element in the chain (thus forming a ring structure). The structure off all such ring oscillators is intended to provide a periodic output pulse signal. The frequency and/or the duty cycle of the periodic output pulse signal may be usefully in a number of applications. As applied to IC fabrication process monitoring cells, the ring oscillator structure output signal indicates a quality measure of the integrated circuit fabrication processes utilized to manufacture the integrated circuit. Where the pulse signal occurs slower than expected (expected in accordance with design goals of the integrated circuit designer) fabrication quality aspects may have rendered the integrated circuit to slow for its intended purpose. Process monitor cells and the ring oscillator structures associated therewith therefore provide a measure of IC fabrication quality that may be tested within the integrated circuit by enabling the process monitor cell operation and detecting the frequency of detected event pulses generated by the ring oscillator.

The SRAM structure ring oscillator 300 associated with the present invention utilizes SRAM circuit elements configured in such a ring structure so as to provide a process quality measure associated with actual SRAM devices (and the associated tighter tolerances associated therewith). SRAM ring oscillator structure 300 may include one or more SRAM stages (also referred to as SRAM columns). For example, as shown in FIG. 4, SRAM column 1 (420) is coupled to a next SRAM column 2 (422) and so on for a total of 32 SRAM columns. Those of ordinary skill in the art will recognize that any number of such SRAM columns may be utilized in accordance with a desired delay period to be measured. The delay period associated with the SRAM structure ring oscillator is determined, in part, by the total number of such SRAM stages linked together sequentially in the ring structure. SRAM structure ring oscillator 300 may comprise as few as a single SRAM column forming a ring by coupling the output thereof to the input thereof. However, such a small ring structure would not likely generate sufficient delay to represent a statistically meaningful quality measure. Further, additional SRAM stages are preferred to provide a statistical sampling of a number of SRAM cells fabricated within the SRAM process monitor cell. Such a statistical average provides a more meaningful measure of the process quality as it relates to SRAM elements in the integrated circuit. As noted, one exemplary embodiment of the invention provides for 32 SRAM columns to be linked in a sequential fashion as further described herein below.

An output signal path of each SRAM column (i.e., path 404 of stage 420 and path 419 of stage 422) is linked to the input path of a next SRAM column. Such a sequential coupling is repeated for each SRAM column and the last SRAM column is linked to the input of the first SRAM column to thus form a ring structure. Signals propagate through the ring structure with predetermined delays in propagation based on operation of each SRAM column of the structure. Integrated circuit fabrication process variations may modify this delay period such that changes in the delay for signals propagating through the ring structure may be indicative of quality of the overall circuit as it relates to SRAM structures in the integrated circuit.

In particular, output signal bitline 404 of SRAM column 420 is applied through inverter 406 to input path 418 of SRAM column 422. In like manner, output signal path bitline 419 of SRAM column 422 is applied through inverter 423 to a next SRAM column and so forth for all SRAM columns of the ring. The output signal path of the last SRAM column (not shown) is connected through its corresponding inverter (not shown) to signal path 312 serving as an input to SRAM column 420.

Signal path 312 also serves to provide an output signal of the ring oscillator and is applied to the counter structure identified above with reference to FIG. 3. Those of other ordinary skill in the art will recognize that the output signal path from such a ring oscillator structure may be provided from any of the several stages of the ring structure. Output signal path 312 therefore may be provided from an input or output signal of any of the individual stages of the ring. Signal path 312 is therefore merely representative of one possible choice of an output signal from the ring structure.

Each SRAM column or stage (i.e., 420 or 422 as depicted in FIG. 4) comprises at least one SRAM cell. Preferably, the SRAM cell or cells used in each stage or column of the ring structure are similar to SRAM cells used in operational components of the integrated circuit. The particular type of SRAM cell used for the ring structure may therefore be any typical SRAM cell and or a mixture of various types of SRAM cells representative of those used in the operational features of the integrated circuit. As shown in FIG. 4, an exemplary SRAM cell includes two pass gate transistors (402 and 408) coupled to a storage element 412. Numerous storage element structures are known to those of ordinary skill in the art. Storage element 412 as depicted in FIG. 4 is commonly referred to as "cross-coupled inverters" and is intended to be representative of any number of well-known storage element structures for SRAM circuits.

Within each stage of the SRAM structure ring oscillator 300, one or more such SRAM cells may be provided to form the column structure. At least one of the SRAM cells is coupled as described further herein below to provide the desired ring to structure functionality while other SRAM cells may be designed into each column to provide capacitive load factors desired to simulate operational SRAM structures in the integrated circuit. Therefore, any number of SRAM cells may be included within each of the SRAM columns of the ring structure and any number of such columns may be provided in the ring structure. Still further, it will be recognized that each column may include a different number of SRAM cells in its particular structure (i.e., the columns need not have the identical number of SRAM cells).

The first SRAM cell 401 of the first stage 420 has its an input signal path 416 coupled to the gate input of pass gate transistor 402. Input signal path 416 is also coupled to the gate signal of precharge transistor 400. Precharge transistor 400 and pass gate transistor 402 are preferably of opposite transistor types. As shown in FIG. 4, pass gate transistor 402 may be an N-type transistor while precharge transistor 400 and may be a P-type transistor. Using opposite transistor types with the same input signal applied to the gates of both transistors ensures that when precharge transistor 400 is on, pass gate transistor 402 will be turned off and vice versa.

Storage element 412 is also connected to a logic high voltage signal such that when input signal path 416 is asserted to a logic high signal, causing pass gate transistor 402 to turn on and precharge transistor 400 to turn off, residual potential on signal path bitline 404 will discharge through pass gate transistor 402 into storage element 412. In normal operation, when input signal path 416 is asserted to a logic low voltage, bitline 404 will precharge to the potential applied through precharge transistor 400 (i.e., Vdd). Pass gate transistor 402 is also turned off thereby preventing significant discharge of bitline 404 during the precharge period.

Bitline 404 therefore will oscillate in substantially opposite phase to signals apply to input signal path 416. However, the discharge of bitline 404 will be delayed in accordance with a current sink capabilities of pass gate transistor 402 of SRAM cell 401. The delay in the discharge of bitline 404 is indicative of the precision and accuracy of processes in fabricating pass gate transistor 402 and hence fabrication processes associated with construction of SRAM cell 401.

Further as noted above, the sequential chaining of the bitline output signal 404 to a next SRAM column's input signal path 418 and so on in a ring structure, provides for multiplying the bitline discharge delay by the number of stages in the ring structure. Such a statistical average bitline delay may be determined by measuring the frequency of oscillations signals output from the ring oscillator structure such as output signal path 312. The number of such stages employed in such an SRAM ring oscillator structure is a matter of design choice well-known to those ordinary skill in the art. In general, the number of stages should be selected to provide a statistically meaningful average of delay times associated with pass gate transistor fabrication quality. In the ring oscillator structure 300 of FIG. 4, 32 such SRAM columns are provided to appropriately scale the output signal on signal path 312 to a desirable statistically meaningful counter input signal frequency. Those of ordinary skill in the art will recognize that any number of stages may be employed in such a ring oscillator structure to achieve a desired output signal frequency.

Further, those ordinary skill in the art will recognize that the output signal 312 generated by such a ring oscillator structure may be generated as a combination of signals generated within the ring oscillator structure 300.

Within each SRAM column of SRAM structure ring oscillator 300, a plurality of additional SRAM cell structures may be fabricated in such a manner as to provide a capacitive load on the associated bitline of the corresponding stage. For example, as shown in FIG. 4, the dashed line surrounding SRAM cell 410 indicates one or more optional SRAM cells each having their associated pass gate transistor coupled to bitline 404. Pass gate transistors of the additional SRAM cells 410 may have their respective gate signals tied to an appropriate constant logic signal to maintain the gate transistors in an off state. In this off state, bitline 404 does not discharge through the pass gate transistors of the additional SRAM cells 410 (other than relatively small leakage current through the closed transistors). Rather, the additional SRAM cells provide a capacitive load simulating the capacitive load within operational SRAM structures of the integrated circuit. This feature of the present intention allows the SRAM process monitor cell to provide a measure of the fabrication process quality as relates to capacitive loading within standard operational SRAM structures of an integrated circuit.

The capacitive load generated by such additional SRAM cells 410 within each stage (420 and 422) of the SRAM structure ring oscillator is another factor affecting the frequency and duty cycle of the output signal path 312 used to drive the counter portion of the process monitor cell.

Those of ordinary skill in the art will recognize that any number of additional SRAM cells may be added to each stage of the ring oscillator 300 to achieve a desired capacitive loading effect. Further, each stage or SRAM column (420 and 422) of the SRAM structure ring oscillator 300 may have a different number of additional SRAM cells 410 added to impose capacitive load. More generally, those of ordinary skill in the art will recognize a variety of SRAM structure ring oscillator designs using standard SRAM cell components to simulate operational SRAM structures within an integrated circuit for purposes of testing integrated circuit fabrication process quality. The particular structure depicted in FIG. 4 happens to utilize 32 stages in an SRAM structure ring oscillator where each stage includes 31 additional SRAM cells 410 added to impose capacity of loading on the corresponding bitline of the stage. In other words, the SRAM process monitor cell ring oscillator of FIG. 4 uses a 32 bit by 32 bit SRAM array to test IC fabrication process quality as it relates to SRAM cells. Structures utilizing other numbers of stages and other structures for capacitive loading will be readily apparent to those of ordinary skill in the art.

AND gate 310 provides an additional feature of a ring oscillator 300 to enable and disable operation of the oscillator structure. To permit the ring oscillator structure to continue running even when testing procedures are not presently active would dissipate significant energy within the integrated circuit structure. Such wasteful dissipation of energy is generally undesirable in the normal operation of an integrated circuit. AND gate 310 therefore is added to disable operation of the ring oscillator structure 300. In particular, AND gate 310 is added to any one of the one or more stages (i.e., 420 and 422) of the ring oscillator structure so as to gate the input signal to a first stage of the ring oscillator structure. A first input to AND gate 310 is the bitline output signal (inverted) from the preceding stage of the ring oscillator structure 300. As depicted in FIG. 4, AND gate 310 is associated with the first stage 420 of the ring oscillator structure and therefore is coupled to the output (inverted) of the last stage of the ring oscillator (not shown). A second input to and gate 310 is an enable control signal asserted logic high by a control element (not shown in FIG. 4). The control element asserts the enable signal logic high to enable operation of the ring oscillator. When the enable signal input applied to AND gate 310 is asserted to a logic low signal, the input signal 416 to the first stage 420 of ring oscillator structure 300 will never be asserted logic high and hence none of the stages of ring oscillator structure 300 will change their respective bitline output signals (thus disabling generation of an output signal on output signal path 312 of ring oscillator structure 300).

FIG. 5 is a timing diagram providing approximate timing relationships of signals associated with the ring oscillator structure 300 of FIG. 4. In particular, the timing diagram of FIG. 5 shows the output of AND gate 310 as input signal path 416 applied to the gate input of pass gate transistors 402 and 408 of SRAM cell 414 of FIG. 4. Also shown is the corresponding output of bitline 404 of the first stage 420 of ring oscillator structure 300 of FIG. 4. In particular, bitline 404 is pre-charged to logic high prior to the low to high transition of signal path 416. Upon such a transition to a logic high voltage on input signal path 416 (thereby closing the precharge transistor and opening the pass gate transistor of the first stage of the ring oscillator), bitline 404 begins to slowly discharge by sinking current through the pass gate transistor of the SRAM cell. The signal on bitline 404 is applied as an input signal to inverter 406. As bitline 404 discharges, a logic low threshold voltage is eventually attained thereby causing the inverter 406 associated with the first stage to assert a logic high signal as the input to the second stage input signal path 418. The process is duplicated in this second stage such that its input signal opens the precharge transistor gate and closes the pass gate transistor gate signal to cause discharge of the precharge bitline signal path 419 of the second stage. Such timing sequences continue sequentially from stage to stage until the last stage output signal is applied back as input to the first stage input signal (416) as gated by the enabling AND gate.

Also shown in the timing diagram of FIG. 5 is a transition from high to low of the input signal path 416 for the first stage. This high to low transition switches the states of the pass gate and precharge transistors to rapidly pre-charge the corresponding bitline output 404 of the first stage. In like manner, each subsequent stage eventually detects its corresponding input signal path transitioning from high to low thereby causing its corresponding bitline to be precharged again. Thus, the ring oscillator structure continues operation cycling through the ring of SRAM cells to thereby generate a pulsed output signal (output signal path 312 of FIG. 4) wherein the frequency and duty cycle of the pulsed output signal may be used to measure qualitative aspects of the fabrication process used for generating operational SRAM cells within an integrated circuit. Such a periodic output signal is also shown in FIG. 5 as output signal path 312. The period between output signal pulses is determined principally as a function of the bitline discharge time which is, in large part, determined by the current sinking capabilities of the pass gate transistor in each of the stages of the SRAM structure ring oscillator of FIG. 4. The time required for recharge of the bitline and hence the duty cycle of output signal 312 is determined in large part by the capacitive load imposed by additional SRAM cells within each stage of the ring oscillator structure. As noted above, both the frequency and duty cycle of output signal 312 may be adapted by appropriate configuration of the SRAM structure process monitor cell. The number of stages in large part determines the frequency of the output signal while they capacitive loading within each stage largely determines the duty cycle of output signal path 312.

As noted above, those of ordinary skill in the art will recognize that any number of stages and additional capacitive loads per stage may be employed to achieve a desired output signal 312. In particular, those of ordinary skill in the art will recognize that as few as one stage may be employed having only a single SRAM cell. Such a simplified ring structure, though within the scope of the present intention, would provide an extremely high frequency output signal that may potentially limit use of the signal for purposes of counting. Further, such a simple ring structure does not effectively average the effects of fabrication processes over multiple SRAM cells as may exist in a typical SRAM structure of an integrated circuit. Hence, a plurality of stages may be preferred in most practical applications of such a ring oscillator structure. Further, each stage may include zero or more additional SRAM cells for purposes of modifying the duty cycle of the output signal generated by the ring oscillator structure. By so modifying the capacitive load on the bitlines of the ring oscillator, the duty cycle of the pulsed output signal of the ring may be modified.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. A process monitor cell for use in testing an integrated circuit, said process monitor cell comprising:
    a counter for counting test events associated with SRAM devices of said integrated circuit; and
    an SRAM performance monitor circuit coupled to said counter for generating a test signal representing said test events.

2. The cell of claim 1 wherein said SRAM performance monitor circuit further comprises:
    a plurality of SRAM circuits coupled to one another as a ring oscillator to determine the performance of SRAM circuits in said integrated circuit as a delay parameter, wherein a bitline of a select SRAM circuit of said plurality of SRAM circuits generates said test signal.

3. The cell of claim 2 wherein said plurality of SRAM circuits comprises:
    a predetermined number of SRAM circuits wherein said predetermined number is selected to achieve a predetermined aggregate delay period between pulses of said test signal.

4. The cell of claim 1 wherein said SRAM performance monitor circuit further comprises:
    a plurality of columns of SRAM circuits coupled to one another as a ring oscillator to determine the performance of SRAM circuits in said integrated circuit as a delay parameter, wherein a bitline of a select SRAM column of said plurality of columns of SRAM circuits generates said test signal.

5. The cell of claim 4 wherein said plurality of columns of SRAM circuits comprises:
    a predetermined number of SRAM columns wherein said predetermined number is selected to achieve a predetermined aggregate delay period between pulses of said test signal.

6. The cell of claim 4 wherein each SRAM column of said plurality of columns of SRAM circuits further comprises:
    a plurality of SRAM circuits each having a pass gate transistor wherein the pass gate transistor of said each SRAM circuit couples said each SRAM circuit to a common bitline signal path for all SRAM devices of the corresponding SRAM column.

7. The cell of claim 1 wherein said SRAM performance monitor circuit further comprises:
   a bitline signal path;
   at least one SRAM circuit wherein each SRAM circuit of said at least one SRAM circuits includes a pass gate transistor for coupling said each SRAM circuit to said bitline signal path and an input signal path coupled to the gate of said pass gate transistor;
   a precharge transistor of a type opposite that of said pass gate transistor and having a gate input coupled to said input signal path; and
   an inverter having an input coupled to said bitline signal path and an output communicatively coupled with said input signal path to form a ring oscillator circuit.

8. The cell of claim 7 wherein said at least one SRAM circuit includes:
   a second SRAM circuit having a second pass gate transistor coupled to said bitline signal path and having the gate input of said second pass gate transistor coupled to a fixed logic level signal effective to turn off the gate of said second pass gate transistor such that said second SRAM circuit provides a capacitive load on said bitline.

9. A ring oscillator comprising:
   a plurality of SRAM columns including at least a first SRAM column and a last SRAM column wherein each SRAM column includes:
      an SRAM circuit including at least a storage element coupled to a logic high voltage source, a pass gate transistor having a gate input, an input signal path coupled to said gate input and an output bitline signal path coupled to another signal path of said pass gate transistor;
      a precharge transistor being of a type opposite that of said pass gate transistor and including a precharge gate input coupled to said input signal path and having one signal path coupled to a logic high voltage source and having another signal path coupled to said bitline signal path; and
      an inverter having an input coupled to said bitline signal path and having an output signal path,
      wherein the output signal path of the inverter of said each SRAM column is coupled to said input signal path of a next SRAM column of said plurality of SRAM columns and where the output signal path of the inverter of said last SRAM column is coupled to said input signal path of said first SRAM column.

10. The ring oscillator of claim 9 further comprising:
   an AND gate coupled between said output signal path of said inverter of said last SRAM column and said input signal path of said first SRAM column such that the output of said AND gate is coupled to said input signal path of said first SRAM column and such that a first input of said AND gate is coupled to said output signal path of said last SRAM column and such that a second input of said AND gate is coupled to an enable signal path to permit selective enabling of the operation of said ring oscillator.

11. The ring oscillator of claim 9 wherein said storage element of each SRAM circuit comprises cross-coupled inverters.

12. The ring oscillator of claim 9 wherein said each SRAM circuit comprises a multiported SRAM circuit.

13. An integrated circuit including:
   operational SRAM devices; and
   an SRAM process monitor cell for monitoring fabrication process quality impacts on said operational SRAM devices.

14. The circuit of claim 13 wherein said cell includes:
   an SRAM structure ring oscillator for generating a periodic pulsed output signal; and
   a counter having a counter input signal path coupled to said pulsed output signal for counting a number of said pulses.

15. The circuit of claim 14 wherein said ring oscillator comprises:
   a plurality of SRAM columns including at least a first SRAM column and a last SRAM column wherein each SRAM column includes:
      an SRAM circuit including at least a storage element coupled to a logic high voltage source, a pass gate transistor having a gate input, an input signal path coupled to said gate input and an output bitline signal path coupled to another signal path of said pass gate transistor;
      a precharge transistor being of a type opposite that of said pass gate transistor and including a precharge gate input coupled to said input signal path and having one signal path coupled to a logic high voltage source and having another signal path coupled to said bitline signal path; and
      an inverter having an input coupled to said bitline signal path and having an output signal path,
      wherein the output signal path of the inverter of said each SRAM column is coupled to said input signal path of a next SRAM column of said plurality of SRAM columns and where the output signal path of the inverter of said last SRAM column is coupled to said input signal path of said first SRAM column.

16. The ring oscillator of claim 15 further comprising:
   an AND gate coupled between said output signal path of said inverter of said last SRAM column and said input signal path of said first SRAM column such that the output of said AND gate is coupled to said input signal path of said first SRAM column and such that a first input of said AND gate is coupled to said output signal path of said last SRAM column and such that a second input of said AND gate is coupled to an enable signal path to permit selective enabling of the operation of said ring oscillator.

17. The ring oscillator of claim 15 wherein said storage element of each SRAM circuit comprises cross-coupled inverters.

18. The ring oscillator of claim 15 wherein said each SRAM circuit comprises a multiported SRAM circuit.

* * * * *